(12) United States Patent
Bulja et al.

(10) Patent No.: US 11,888,457 B2
(45) Date of Patent: Jan. 30, 2024

(54) RADIO COMMUNICATIONS

(71) Applicant: NOKIA TECHNOLOGIES OY, Espoo (FI)

(72) Inventors: Senad Bulja, Dublin (IE); Kim Nielsen, Storvorde (DK)

(73) Assignee: NOKIA TECHNOLOGIES OY, Espoo (FI)

( * ) Notice: Subject to any disclaimer, the term of this patent is extended or adjusted under 35 U.S.C. 154(b) by 0 days.

(21) Appl. No.: 17/448,983

(22) Filed: Sep. 27, 2021

(65) Prior Publication Data

US 2022/0123704 A1 Apr. 21, 2022

(30) Foreign Application Priority Data

Sep. 28, 2020 (FI) ...................... 20205933

(51) Int. Cl.
*H03H 1/00* (2006.01)
*H01P 1/18* (2006.01)
*H04B 1/00* (2006.01)

(52) U.S. Cl.
CPC .................. *H03H 1/00* (2013.01); *H01P 1/18* (2013.01); *H04B 1/0067* (2013.01)

(58) Field of Classification Search
CPC .......... H01P 1/18; H01P 1/2039; H01P 7/088; H03H 1/00; H03H 7/0123; H04B 1/0067
See application file for complete search history.

(56) References Cited

U.S. PATENT DOCUMENTS

| | | | |
|---|---|---|---|
| 7,292,124 B2 | 11/2007 | Kawai et al. | |
| 7,777,597 B2 | 8/2010 | Beaudin et al. | |
| 10,236,860 B1 | 3/2019 | Kozyrev | |
| 10,476,157 B1 | 11/2019 | Segoria | |
| 2003/0060170 A1 | 3/2003 | Tikka et al. | |
| 2009/0027141 A1 | 1/2009 | Oshima | |
| 2012/0161904 A1 | 6/2012 | Do et al. | |
| 2012/0229231 A1 | 9/2012 | Mi et al. | |
| 2012/0235877 A1 | 9/2012 | Beaudin et al. | |

(Continued)

FOREIGN PATENT DOCUMENTS

| | | |
|---|---|---|
| CN | 102497172 A | 6/2012 |
| CN | 110999081 A | 4/2020 |

(Continued)

OTHER PUBLICATIONS

Extended European Search Report for European Application No. 21198337.4 dated Feb. 18, 2022, 13 pages.

(Continued)

*Primary Examiner* — Nguyen T Vo
(74) *Attorney, Agent, or Firm* — ALSTON & BIRD LLP

(57) ABSTRACT

Circuitry comprising: a first resonant radio frequency conductive path between a first node and a third node; a second resonant radio frequency conductive path between a second node and the third node; an internode radio frequency conductive path between the first node and the second node; a shunt resonant element coupled to the third node and shared by the first resonant radio frequency conductive path and the second resonant radio frequency conductive path; and a phase shift element for introducing a relative phase shift to the first resonant radio frequency conductive path relative to the second resonant radio frequency conductive path.

19 Claims, 9 Drawing Sheets

(56) References Cited

U.S. PATENT DOCUMENTS

| | | | |
|---|---|---|---|
| 2015/0236390 | A1 | 8/2015 | Analui et al. |
| 2015/0236395 | A1 | 8/2015 | Analui et al. |
| 2015/0311882 | A1 | 10/2015 | Bulja |
| 2017/0301992 | A1 | 10/2017 | Khlat et al. |
| 2018/0048345 | A1 | 2/2018 | Pehlke et al. |
| 2019/0044492 | A1 | 2/2019 | Takata |
| 2019/0326944 | A1 | 10/2019 | Khlat et al. |
| 2019/0334563 | A1 | 10/2019 | Elbrecht et al. |
| 2020/0153412 | A1* | 5/2020 | Nosaka .............. H03H 9/72 |

FOREIGN PATENT DOCUMENTS

| | | |
|---|---|---|
| EP | 2 007 012 A2 | 12/2008 |
| EP | 2 498 332 A1 | 9/2012 |
| WO | WO 2019/173101 | 9/2019 |

OTHER PUBLICATIONS

"3rd Generation Partnership Project; Technical Specification Group Radio Access Network; NR; User Equipment (UE) radio transmission and reception; Part 1: Range 1 Standalone (Release 16)", 3GPP TS 38.101-1 v16.4.0, (Jul. 2020), 408 pages.

"Code of Federal Regulations (annual edition), Title 45: Telecommunication. Subpart E: Unlicensed National Information Infrastructure Devices", 47 CFR § 15,407, General Technical Requirements, (Jan. 16, 2020), pp. 923-926.

"IEEE Standard for Information technology; Telecommunications and information exchange between systems; Local and metropolitan area networks; Specific requirements; Part 11: Wireless LAN Medium Access Control (MAC) and Physical Layer (PHY) Specifications; Amendment 4: Enhancements for Very High Throughput for Operation in Bands below 6 GHz", IEEE 802.11ac-2013, (Dec. 18, 2013), 425 pages.

"Innovative BAW Filters for 5G", Qorvo Design Hub Brochure, (Feb. 3, 2020), 2 pages.

Balteanu et al., "5G Rf Front End Module Architectures for Mobile Applications", Proceedings of the 49th European Microwave Conference, (Oct. 1-3, 2019), 4 pages.

Luo et al., "Design of Wi-Fi Band-Pass Filter Based on HMSIW", 2017 $9^{th}$ International Conference on Intelligent Human-Machine Systems and Cybernetics, (Aug. 26-27, 2017), 4 pages.

Naglich et al., "Tunable, Substrate Integrated, High Q Filter Cascade for High Isolation", 2010 IEEE MTT-S International Microwave Symposium, (May 23-28, 2010), 4 pages.

Office Action for Finland Application No. 20205933 dated Nov. 30, 2020, 10 pages.

Skyworks, "5 GHz Wi-Fi Coexistence with 5G Cellular for Improved User Experience", Technical Article, [Retrieved on Dec. 9, 2021] Retrieved via the Internet: <URL: https://www.skyworksinc.com/-/media/SkyWorks/Documents/Articles/Wi-Fi-Coexistence.pdf>., (Mar. 5, 2020), 4 pages.

First Examination Report for Indian Application No. 202114044095 dated May 19, 2022, 6 pages.

Office Action for Chinese Application No. 202111133703.8 dated Sep. 1, 2023, 22 pages.

* cited by examiner

RADIO COMMUNICATIONS

CROSS-REFERENCE TO RELATED APPLICATIONS

This application claims priority to Finnish Application No. 20205933, filed Sep. 28, 2020, the entire contents of which are incorporated herein by reference.

TECHNOLOGICAL FIELD

Embodiments of the present disclosure relate to radio communications and, in particular, apparatus for radio communication.

BACKGROUND

Radio communications occur using different radio access technologies (RAT). A single radio access technology can use one or more frequency bands for transmitting/receiving radio signals. Different RATs can use the same or different frequency bands for transmitting/receiving radio signals.

It can be desirable to filter a transmitted or received signal so that it is limited to a specific frequency range or frequency ranges. This allows the signal to noise ratio of the analogue radio signal to be improved.

A filter is a frequency selective impedance. A filter can be configured as a pass band filter that has a relatively low impedance for a band of frequencies and relatively high impedance for adjacent frequency bands. A filter can be configured as a band stop filter that has a relatively high impedance for a band of frequencies and a relatively low impedance for adjacent frequency bands.

BRIEF SUMMARY

According to various, but not necessarily all, embodiments there is provided circuitry comprising:

a first resonant radio frequency conductive path between a first node and a third node;

a second resonant radio frequency conductive path between a second node and the third node;

an internode radio frequency conductive path between the first node and the second node;

a shunt resonant element coupled to the third node and shared by the first resonant radio frequency conductive path and the second resonant radio frequency conductive path; and a phase shift element for introducing a relative phase shift to the first resonant radio frequency conductive path relative to the second resonant radio frequency conductive path.

In some but not necessarily all examples, the circuitry comprises:

a first radio frequency conductive path between the first node and an intermediate node;

a second radio frequency conductive path between the second node and the intermediate node;

a third radio frequency conductive path between the intermediate node and the third node;

wherein the third radio frequency conductive path comprises the shunt resonant element as a frequency selective impedance that provides a lower impedance path to the third node for a narrower band of frequencies and a higher impedance path to the third node for wider bands of frequencies adjacent the narrower band of frequencies and wherein the first radio frequency conductive path comprises the phase shift element, wherein the first resonant radio frequency conductive path between the first node and the third node comprises the first radio frequency conductive path between the first node and the intermediate node and comprises the third radio frequency conductive path between the intermediate node and the third node;

wherein the second resonant radio frequency conductive path between the second node and the third node comprises the second radio frequency conductive path between the second node and the intermediate node and comprises the third radio frequency conductive path between the intermediate node and the third node;

wherein the first resonant radio frequency conductive path and the second resonant radio frequency conductive path share the intermediate node and the third radio frequency conductive path between the intermediate node and the third node.

In some but not necessarily all examples, the first resonant radio frequency conductive path between the first node and the third node has a single zero transfer function;

the second resonant radio frequency conductive path between the first node and the third node has a single zero transfer function;

the phase shift element separates the zero of the transfer function for the first resonant radio frequency conductive path from the zero of the transfer function for the second resonant radio frequency conductive path.

In some but not necessarily all examples, the first resonant radio frequency conductive path comprises a first radio frequency conductive path between a first node and ground via the shunt resonant element; and the second resonant radio frequency conductive path comprises a second radio frequency conductive path between the second node and the ground via the shunt resonant element.

In some but not necessarily all examples, the shunt resonant element has a single zero transfer function.

In some but not necessarily all examples, the first resonant radio frequency conductive path comprises a first transmission line, the second resonant radio frequency conductive path comprises a second transmission line; the internode radio frequency conductive path comprises a third transmission line.

In some but not necessarily all examples, the first transmission line and the second transmission line are identical branches from the third transmission line except that the first transmission line comprises the phase shift element.

In some but not necessarily all examples, the circuitry is configured to control the phase shift element to change the relative phase shift between the first resonant radio frequency conductive path and the second resonant radio frequency conductive path.

In some but not necessarily all examples, the circuitry is configured to control the phase shift element to select one of a plurality of predefined phase shifts.

In some but not necessarily all examples, the circuitry comprises: one or more additional first resonant radio frequency conductive paths between the first node and the third node each comprising a phase shift element for introducing a relative phase shift to the respective resonant radio frequency conductive path relative to the second resonant radio frequency conductive path.

In some but not necessarily all examples, a band stop filter comprises the circuitry in an in-line series configuration wherein input/output nodes of the filter are coupled to the first and second nodes of the circuitry.

In some but not necessarily all examples, a bandpass filter comprises the circuitry in a shunt configuration to ground wherein input/output nodes of the filter are coupled to the first node of the circuitry and wherein the second node of the circuitry is coupled to ground via an impedance and the third node of the circuitry is coupled to ground.

According to various, but not necessarily all, embodiments there is provided a filter comprising:
first circuitry comprising the circuitry described;
second circuitry comprising the circuitry described;
a four-port cross-coupler comprising four ports:
wherein a first one of the ports is coupled to the first node of the first circuitry,
wherein a second one of the ports is coupled to the first node of the second circuitry, and wherein the other two ports provide input/output ports of the filter.

According to various, but not necessarily all, embodiments there is provided examples as claimed in the appended claims.

BRIEF DESCRIPTION

Some examples will now be described with reference to the accompanying drawings in which.

DETAILED DESCRIPTION

Figure 1:
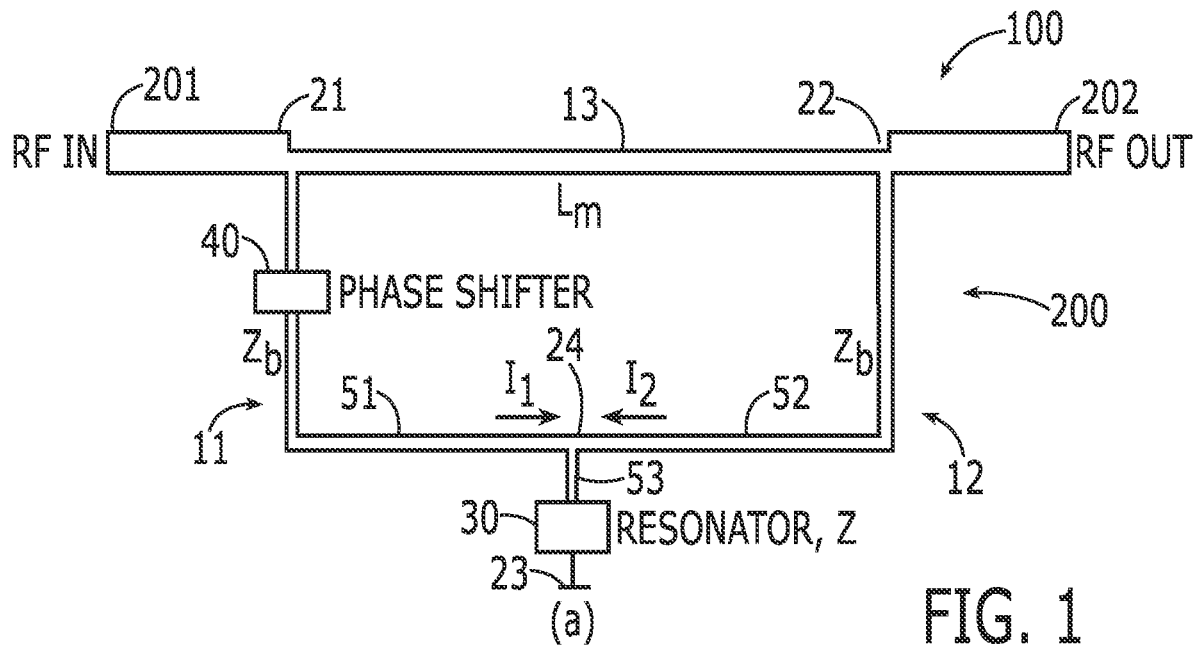
FIG. 1 shows an example of the subject matter described herein.

The drawings illustrate, and the following description describes, various examples of circuitry 100 comprising:
a first resonant radio frequency conductive path 11 between a first node 21 and a third node 23;
a second resonant radio frequency conductive path 12 between a second node 22 and the third node 23;
an internode radio frequency conductive path 13 between the first node 21 and the second node 22;
a shunt resonant element 30 coupled to the third node 23 and shared by the first resonant radio frequency conductive path 11 and the second resonant radio frequency conductive path 12; and
a phase shift element 40 for introducing a relative phase shift to the first resonant radio frequency conductive path 11 relative to the second resonant radio frequency conductive path 12.

FIG. 1 illustrates circuitry 100 for providing a band-stop resonance. The circuitry 100 has a triangular network topology. The circuitry 100 comprises three nodes 21, 22, 24 which form the vertices of a triangle-like topology.

The circuitry 100 has a first radio frequency conductive path 51 between the first node 21 and an intermediate node 24. This forms one edge of the triangle-like topology.

The circuitry 100 has a second radio frequency conductive path 52 between the second node 22 and the intermediate node 24. This forms another edge of the triangle-like topology.

The circuitry 100 has an internode radio frequency conductive path 13 between the first node 21 and the second node 22. This forms a further edge of the triangle-like topology.

The first node 21 and second node 22 are input/output nodes of the circuitry 100. In the example illustrated the first node 21 is an input node and the second node 22 is an output node. However, in other examples, the first node 21 is an output node and the second node 22 is an input node.

The circuitry 100 has a third radio frequency conductive path 53 between the intermediate node 24 and a third node 23. In some examples, the third node is held at a constant potential such as a ground potential. The third node 23 can be described, in some examples, as a ground node indicating that it is or is intended to be grounded.

The circuitry 100 comprises: a first resonant radio frequency conductive path 11 between the first node 21 and the third node 23; a second resonant radio frequency conductive path 12 between the second node 22 and the third node 23; and the internode radio frequency conductive path 13 between the first node 21 and the second node 22.

A shunt resonant element 30 is coupled to the third node 23 and shared by the first resonant radio frequency conductive path 11 and the second resonant radio frequency conductive path 12. The third radio frequency conductive path 53 comprises the shunt resonant element 30. The shunt resonant element is configured to operate as a frequency selective impedance Z that provides a lower impedance path between the intermediate node 24 and the third node 23 for a narrower band of frequencies and a higher impedance path between the intermediate node 24 and the third node 23 for wider bands of frequencies adjacent the narrower band of frequencies. This is illustrated by a transfer function (S-parameter S21) for the shunt resonant element 30.

The circuitry 100 comprises a phase shift element 40 for introducing a relative phase shift to the first resonant radio frequency conductive path 11 relative to the second resonant radio frequency conductive path 12. The first radio frequency conductive path 51 comprises the phase shift element 40.

The first resonant radio frequency conductive path 11 between the first node 21 and the third node 23 comprises the first radio frequency conductive path 51 between the first node 21 and the intermediate node 24 and comprises the third radio frequency conductive path 53 between the intermediate node 24 and the third node 23.

The second resonant radio frequency conductive path 12 between the second node 22 and the third node 23 comprises the second radio frequency conductive path 52 between the second node 22 and the intermediate node 24 and comprises the third radio frequency conductive path 23 between the intermediate node 24 and the third node 23.

The first resonant radio frequency conductive path 11 and the second resonant radio frequency conductive path 12 share the intermediate node 24 and the third radio frequency conductive path 53, comprising the shunt resonant element 30, between the intermediate node 24 and the third node 23.

Figures 2A, 2B:
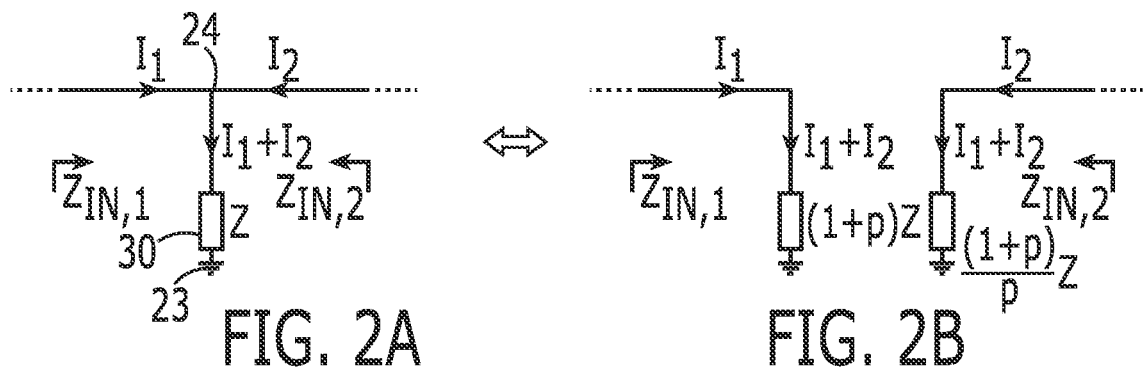
FIGS. 2A & 2B show other examples of the subject matter described herein.

The operation of the circuitry 100 is schematically illustrated in FIGS. 2A and 2B. FIG. 2A illustrates that current I1 carried by the first radio frequency conductive path 51 and current I2 carried by the second radio frequency conductive path 52 join at the intermediate node 24 to create the current I1+I2 carried by the third radio frequency conductive path 53 through shunt resonant element 30 of impedance Z to the third node 23.

When I2=p*I1 where p is a factor, the input impedance $Z_{in,\,1}$ at the first node 21 is (1+p).Z, and the input impedance $Z_{in,\,2}$ at the second node 22 is ((1+p)/p).Z. The circuitry 100 therefore has two current paths to the third node 23 with potentially different impedance.

Figure 3A:
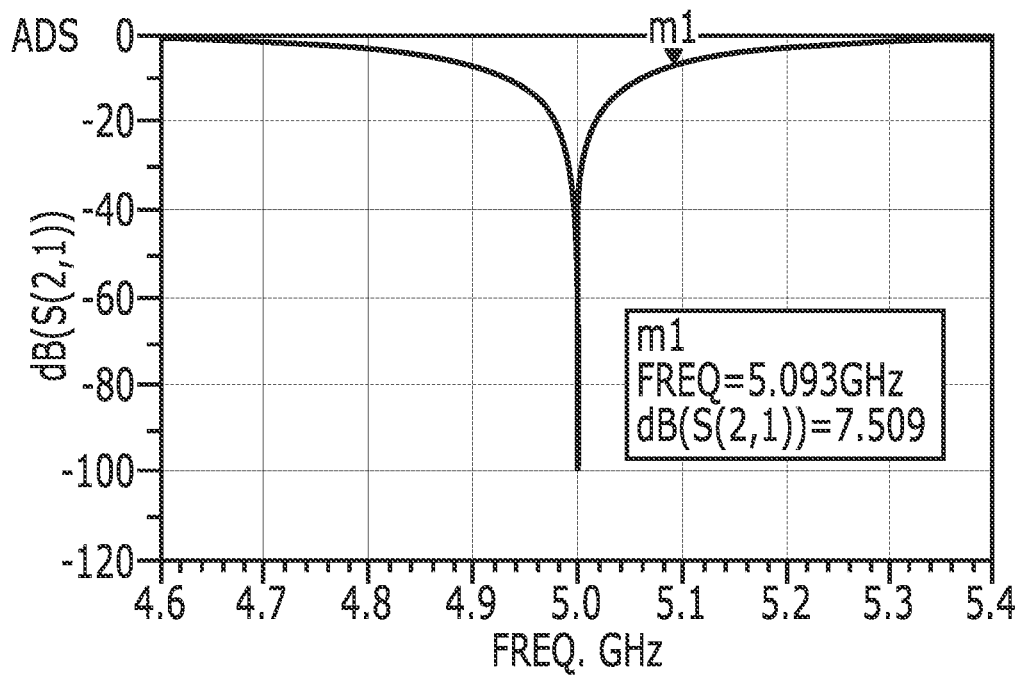
FIGS. 3A & 3B show other examples of the subject matter described herein.

When I1=I2, then p=1, and $Z_{in,\,1}=Z_{in,\,2}$. This occurs when the phase shift provided by the phase shift element 40 is equal to the phase delay provided by the internode radio frequency conductive path 13. When I1=I2, it appears as if one resonator is "replicated", and the combined resonant structure (band-stop behaviour) operates at exactly the same frequency. This condition is called "double zero" and is illustrated in FIG. 3A.

Figure 3B:
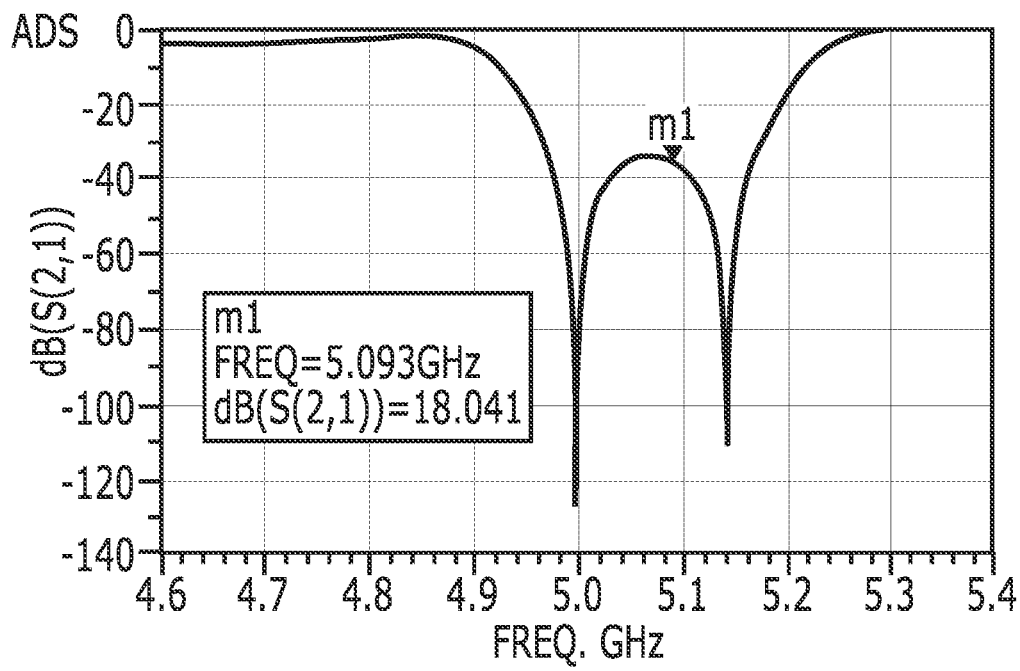

By imposing the condition that p≠1, the first resonant radio frequency conductive path 11 and the second resonant radio frequency conductive path 12 have different impedances. Two separate zeroes at different frequencies are achieved as illustrated in FIG. 3B. The frequency separation between these two resonant frequencies is proportional to $$\Delta\omega \sim |\phi_{shift} - \phi_{internode\_path}|$$

where $\phi_{shift}$ is the phase shift (delay) introduced by the phase shift element 40, and $\phi_{internode\_path}$ is the phase delay provided by the internode radio frequency conductive path 13.

One can model the result as replicated resonators coupling to each other where the extent of coupling is determined by $|\phi_{shift}-\phi_{internode\_path}|$. The extent of coupling also effectively determines a bandwidth of the obtained band-stop filter.

The operational bandwidth of the filter response illustrated in FIG. 3B is between 4.95 GHz and 5.2 GHz at −20 dB to −40 dB.

The first resonant radio frequency conductive path 11 between the first node 21 and the third node 23 has a single zero transfer function. The second resonant radio frequency conductive path 12 between the second node 22 and the third node 23 has a single zero transfer function. The phase shift element 40 separates the zero of the transfer function for the first resonant radio frequency conductive path 11 from the zero of the transfer function for the second resonant radio frequency conductive path 12.

The first resonant radio frequency conductive path 11 comprises a first radio frequency conductive path 51 between a first node 21 and the third node 23 via the shunt resonant element 30. The second resonant radio frequency conductive path 12 comprises a second radio frequency conductive path 52 between the second node 22 and the third node 23 via the same shunt resonant element. The shunt resonant element 30 has, in this example, a single zero transfer function.

The first radio frequency conductive path 51 can comprise a first transmission line, the second radio frequency conductive path 52 can comprise a second transmission line; and the internode radio frequency conductive path 13 can comprise a third transmission line. The first transmission line and the second transmission line can be, for example, identical branches from the third transmission line except that the first transmission line comprises the phase shift element 40.

In some examples, the phase shift element 40 has a fixed value of phase shift introduced to the first radio frequency conductive path 51. In other examples, the phase shift element 40 is configured to vary the value of a phase shift introduced to the first radio frequency conductive path 51. For example, circuitry 100 can be configured to control the phase shift element 40 to change the relative phase shift between the first resonant radio frequency conductive path 11 and the second resonant radio frequency conductive path 12. The circuitry 100 can be configured to control or enable control of the phase shift element 40 to select one of a plurality of predefined phase shifts.

The circuitry 100 can operate as a bandstop filter 200. In this example, the circuitry 100 is arranged in an in-line series configuration where input/output nodes 201, 202 of the filter 200 are coupled to the respective first and second nodes 21, 22 of the circuitry 100. In the example illustrated in FIG. 1 and FIG. 11, when the third node 23 is connected to ground, the band stop filter 200 provides a frequency selective low impedance path to ground via the intermediate node 24, shunt resonant element 30, and the third node 23.

Figure 4:
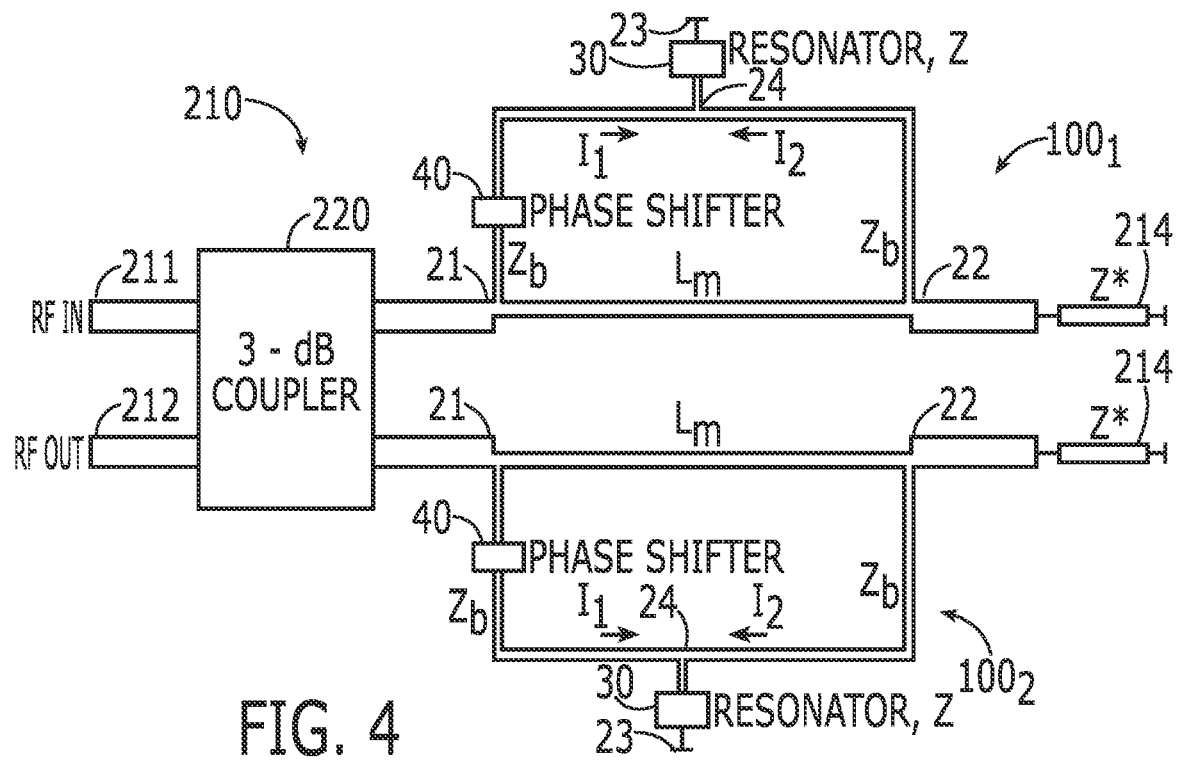
FIG. 4 shows another example of the subject matter described herein.

The circuitry 100 can operate as a band pass filter 210 (e.g. FIG. 4). In this example, the circuitry 100 is arranged in a shunt-to-ground configuration where input/output nodes 211, 212 of the filter are coupled to the first node 21 of the circuitry 100 and the second node 22 of the circuitry 100 is coupled to ground via an impedance 214. The third node 23 of the circuitry 100 is coupled to ground.

FIG. 4 illustrates an example of a filter 210 configured as a band pass filter. The filter 210 comprises first circuitry $100_1$ comprising circuitry 100 as previously described. The filter 210 comprises second circuitry $100_2$ comprising circuitry 100 as previously described.

The filter 210 comprises a four-port cross-coupler 220 comprising four ports. One of the ports is coupled to the first node 21 of the first circuitry $100_1$ and another of the ports is coupled to the first node 21 of the second circuitry $100_2$. The remaining two ports connect directly inside the cross coupler to provide input/output ports 211, 212 of the filter 210.

The first circuitry $100_1$ is configured as a first band stop filter connected via an impedance 214 to ground. The first circuitry $100_1$ is arranged in an in-line series configuration where the first and second nodes 21, 22 of the first circuitry $100_1$ are input/output nodes of the first band stop filter. The third node 23 is connected to ground. The second node 22 is connected to ground via an impedance 214.

The second circuitry $100_2$ is configured as a second band stop filter connected via an impedance 214 to ground. The second circuitry $100_2$ is arranged in an in-line series configuration where the first and second nodes 21, 22 of the second circuitry $100_2$ are input/output nodes of the second band stop filter. The third node 23 is connected to ground. The second node 22 is connected to ground via an impedance 214.

Thus the second order band-stop filter can be transformed into a band-pass filter 210.

The use of a 3-dB coupler as the four-port cross-coupler 220 can produce a reflection-less band-pass filter 210. The creation of the reflection-less bandpass filters is enabled by the constitutive relationship inherent to 3-dB couplers, given by:

$$S_{11}=j*0.5*(\Gamma_1-\Gamma_2) \text{ and } S_{21}=j*0.5*(\Gamma_1+\Gamma_2)$$

Where $\Gamma_1$ and $\Gamma_2$ represent the reflection coefficient of the two loads (first and second band-stop filters). Under the condition that they are identical, i.e. $\Gamma_1=\Gamma_2=\Gamma$, the reflection coefficient, $S_{11}$ vanishes, while the transmission coefficient, $S_{21}$ becomes equal to $j\Gamma$.

Figure 5:
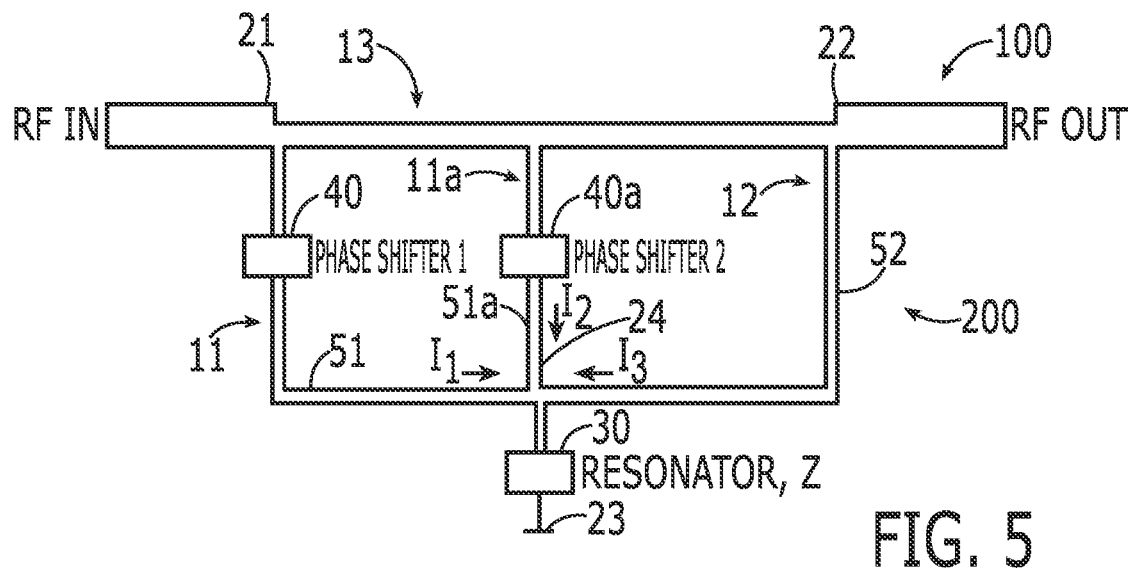
FIG. 5 shows another example of the subject matter described herein.

FIG. 5 illustrates an example of circuitry 100 as previously described and comprising one additional first resonant radio frequency conductive path $11_a$ between the first node 21 and the third node 23. The additional first resonant radio frequency path $11_1$ comprises an additional radio frequency conductive path $51_a$ to the intermediate node 24 and the previously described third radio frequency conductive path 53 between the intermediate node and the third node 23. The third radio frequency conductive path 53, comprising the shunt resonant element 30, is shared by the first resonant radio frequency conductive path 11, the additional first resonant radio frequency conductive path $11_a$ and the second resonant radio frequency conductive path 12.

The additional first resonant radio frequency path $11_a$ comprises a phase shift element $40_a$ for introducing a relative phase shift to the respective resonant radio frequency conductive path $11_a$ relative to the second resonant radio frequency conductive path 12.

In the illustrated example, the additional radio frequency conductive path $51_a$ extends to the intermediate node 24 from a node part-way along the internode radio frequency conductive path 13. In other examples, the additional radio frequency conductive path $51_a$ can extend to the intermediate node 24 from the first node 21.

Figure 6A:
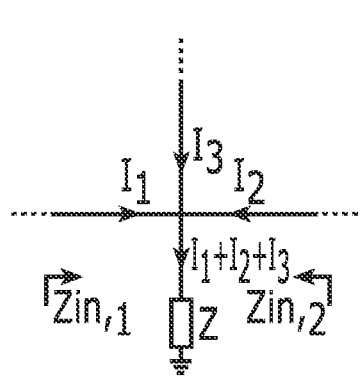
FIGS. 6A & 6B show other examples of the subject matter described herein.
Figure 6B:
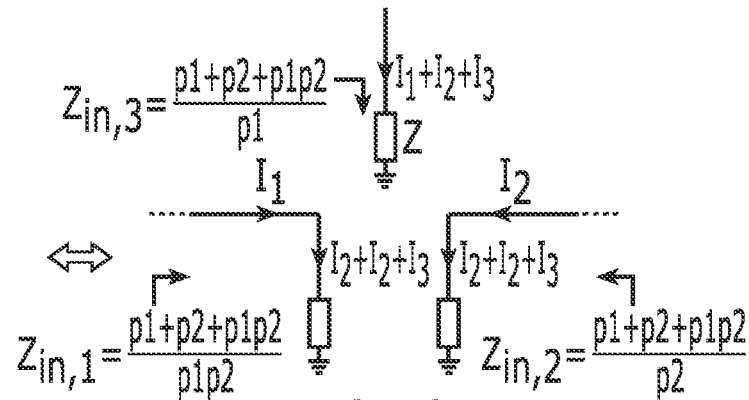

The operation of the 'triple path' circuitry 100 illustrated in FIG. 5 is schematically illustrated in FIGS. 6A and 6B. FIG. 6A illustrates that a current I1 carried by the first radio frequency conductive path 51, a current I3 carried by additional first radio frequency conductive path $51_a$, and a current I2 carried by the second radio frequency conductive path 52 join at the intermediate node 24 to create the current I1+I2+I3 carried by the third radio frequency conductive path 53 through shunt resonant element 30 of impedance Z to the third node 23.

If I1=p1*I2 & I1=p2*I3, then:

the input impedance $Z_{in,\ 1}$ for the first resonant radio frequency conductive path 11 is (p1p2+p2+p1)/p1*p2;

the input impedance In, 2 for the second resonant radio frequency conductive path 12 is (p1p2+p2+p1)/p2.

the input impedance $Z_{in,\ 1a}$ for the additional first resonant radio frequency conductive path $11_a$ is (p1p2+p1+p2)/p1.

The circuitry 100 therefore has three current paths to the third node 23 with potentially different impedance.

When I1=I2=I3, then p1=p2=1, and $Z_{in,\ 1}=Z_{in,\ 2}=Z_{in,\ 3}$. This occurs when the phase shift provided via each path (including phase shifts introduced by the phase shift elements 40, 40a, if any) between the first node 21 and the intermediate node 24 is equal. In this case, it appears as if one resonator is "replicated", and the combined resonant structure (band-stop behaviour) operates at exactly the same frequency. This condition is called "triple zero".

By imposing the conditions that p1≠ p2≠ 1, the first resonant radio frequency conductive path 11, the additional first resonant radio frequency conductive path 11a and the second resonant radio frequency conductive path 12 therefore have different impedances. Three separate zeroes at different resonant frequencies are achieved. The frequency separation between these resonant frequencies is dependent upon the phase shifts introduced by the phase shift elements 40, 40a.

Figure 8:
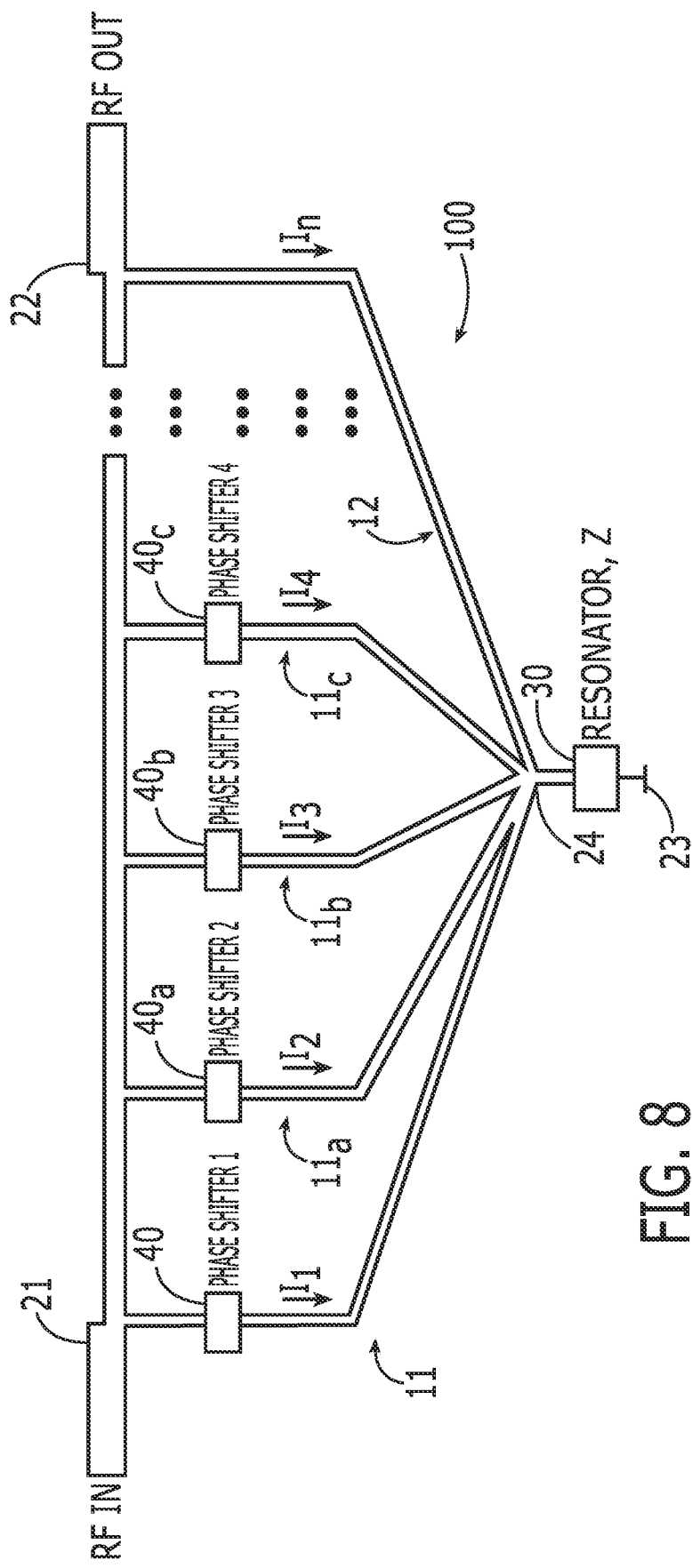
FIG. 8 shows another example of the subject matter described herein.

FIG. 8 illustrates an extension of the circuitry 100 illustrated in FIG. 1 to have multiple additional first resonant-radio frequency conductive paths 11i. If I1=$p_i$*$I_i$, then imposing the conditions pi≠ p(i+1)≠1, for all i=2,3 . . . n, results in an "n-tuple" zero case.

Figure 7:
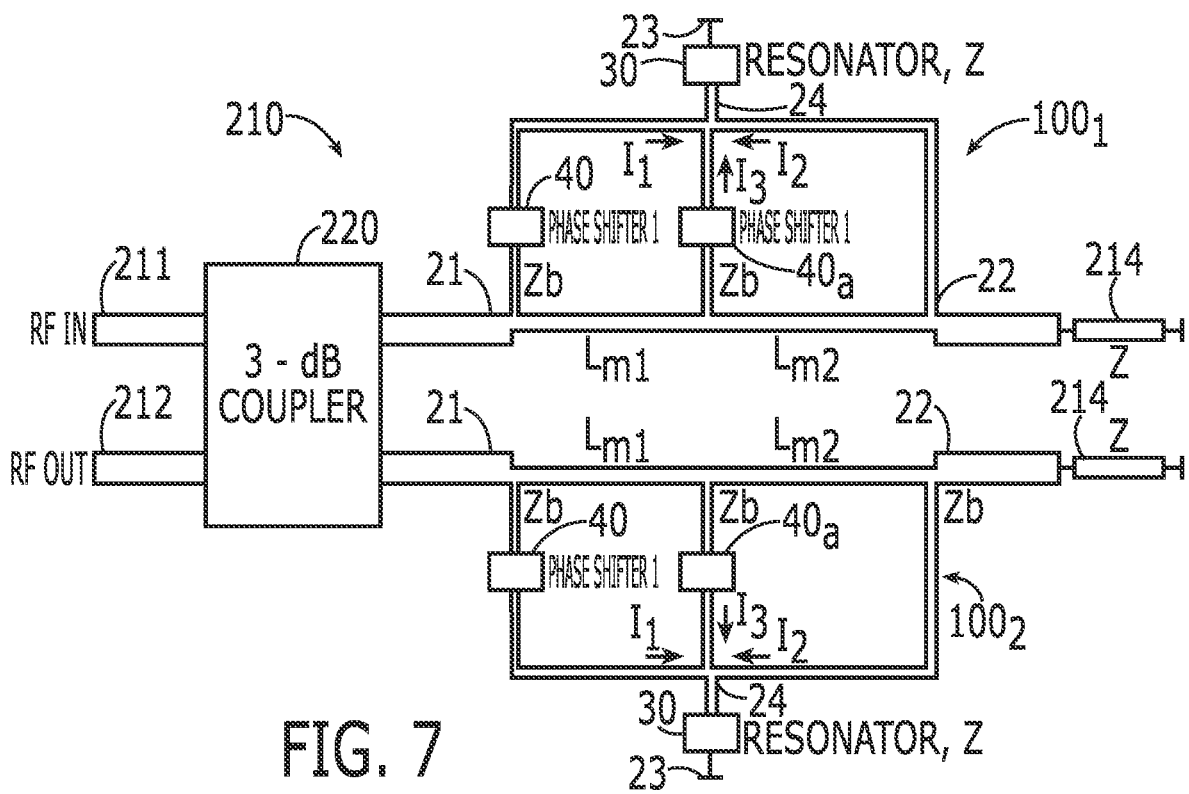
FIG. 7 shows another example of the subject matter described herein.

FIG. 7 illustrates an example of a filter 210 configured as a band pass filter. The filter 210 comprises first circuitry $100_1$ comprising circuitry 100 as previously described with reference to FIG. 5 and comprises second circuitry $100_2$ comprising circuitry 100 as previously described with reference to FIG. 5.

Figure 9:
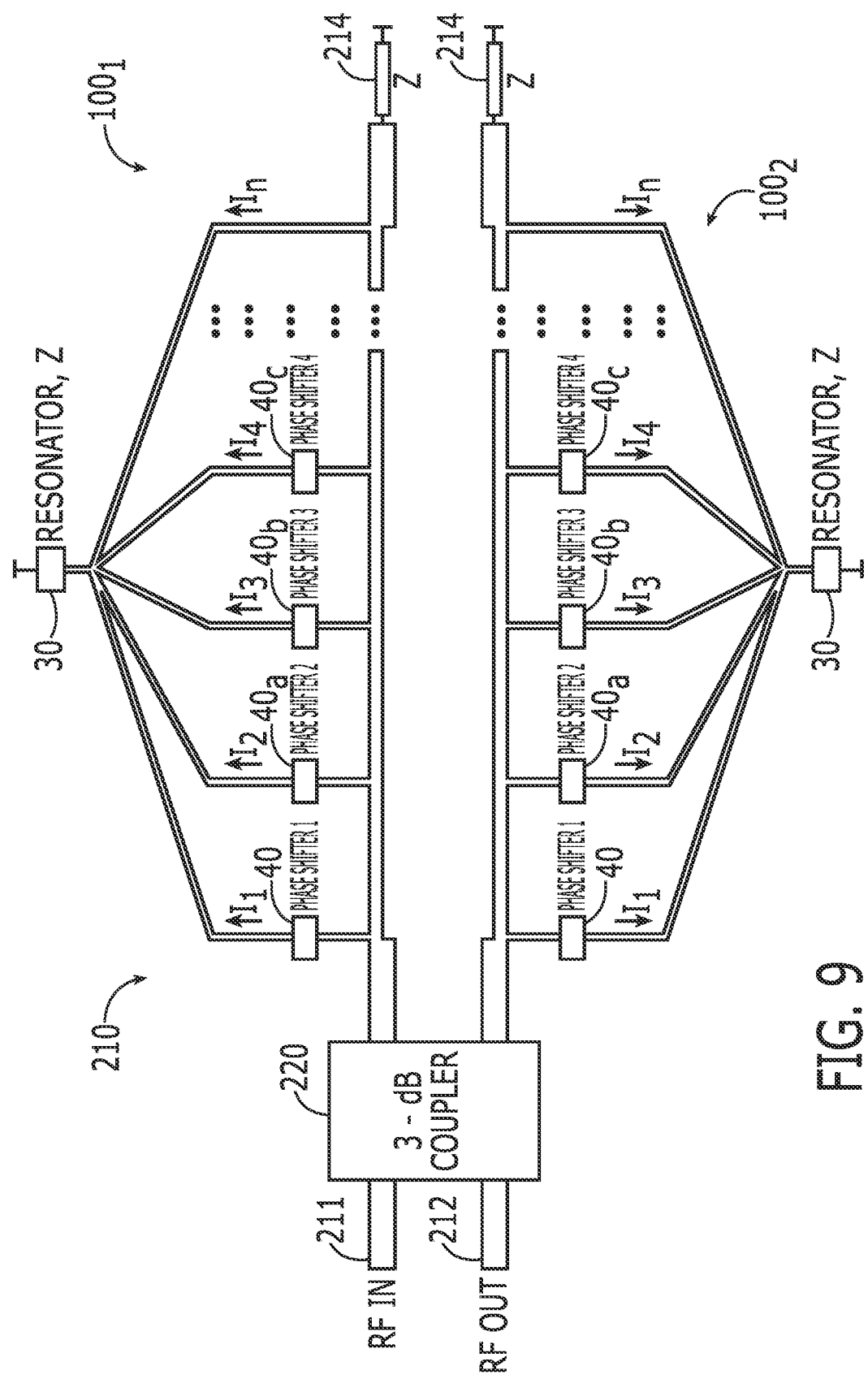
FIG. 9 shows another example of the subject matter described herein.

FIG. 9 illustrates an example of a filter 210 configured as a band pass filter. The filter 210 comprises first circuitry $100_1$ comprising circuitry 100 as previously described with reference to FIG. 8 and comprises second circuitry $100_2$ comprising circuitry 100 as previously described with reference to FIG. 8.

The filter 210 of FIGS. 7 and/or 9 comprises a four-port cross-coupler 220 comprising four ports:

wherein a first one of the ports is coupled to the first node 21 of the first circuitry $100_1$ wherein a second one of the ports is coupled to the first node 21 of the second circuitry $100_2$ and wherein the other two ports connect directly inside the cross coupler to provide input/output ports 211, 212 of the filter 210.

The first circuitry $100_1$ is configured as a first band stop filter connected via an impedance 214 to ground. The first circuitry $100_1$ is arranged in an in-line series configuration where the first and second nodes 21, 22 of the first circuitry $100_1$ are input/output nodes of the first band stop filter. The third node 23 is connected to ground. The second node is connected to ground via an impedance 214.

The second circuitry $100_1$ is configured as a second band stop filter connected via an impedance 214 to ground. The second circuitry $100_2$ is arranged in an in-line series configuration where the first and second nodes 21, 22 of the second circuitry $100_2$ are input/output nodes of the second band stop filter. The third node 23 is connected to ground. The second node is connected to ground via an impedance 214.

The use of a 3-dB coupler as the four-port cross-coupler 220 can produce a reflection-less band-pass filter 210.

FIGS. 10A, 10B, 10C and 10D demonstrate performance of the circuitry 100 configured as different filters. The results for three different topologies are illustrated.

The plots labelled A are single zero. The plots labelled B are double zero. The plots labelled C are triple zero. The resonator(s) 40 are configured to operate at a frequency of 5 GHz and to have an unloaded Q-factor of 500.

Figure 10A:
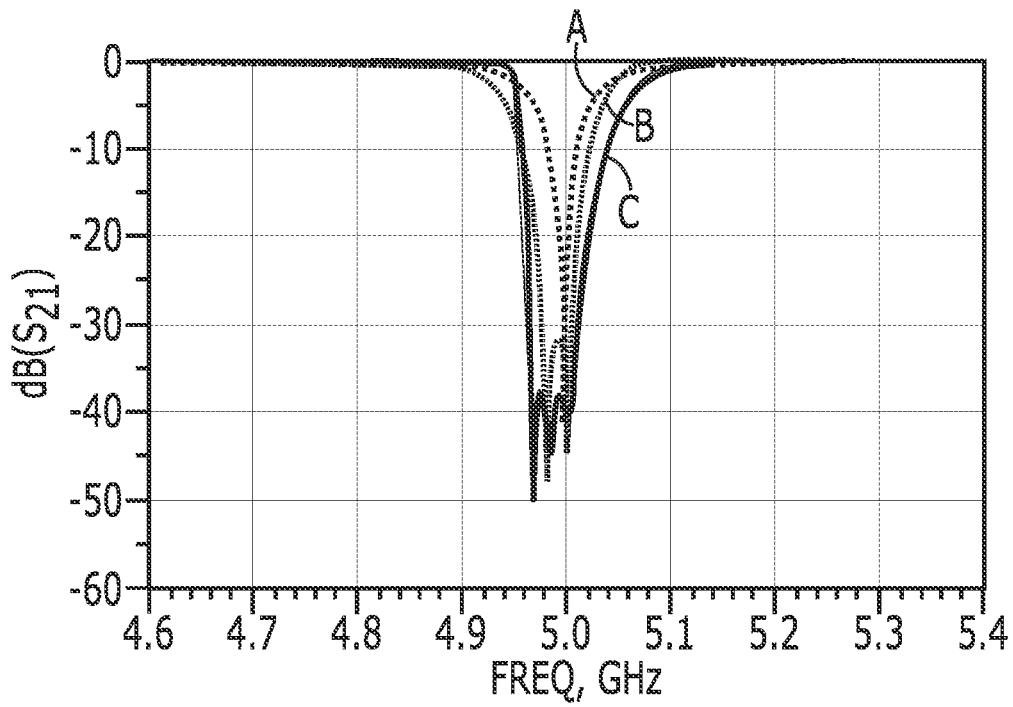
FIGS. 10A, 10B, 10C & 10D show other examples of the subject matter described herein.
Figure 10B:
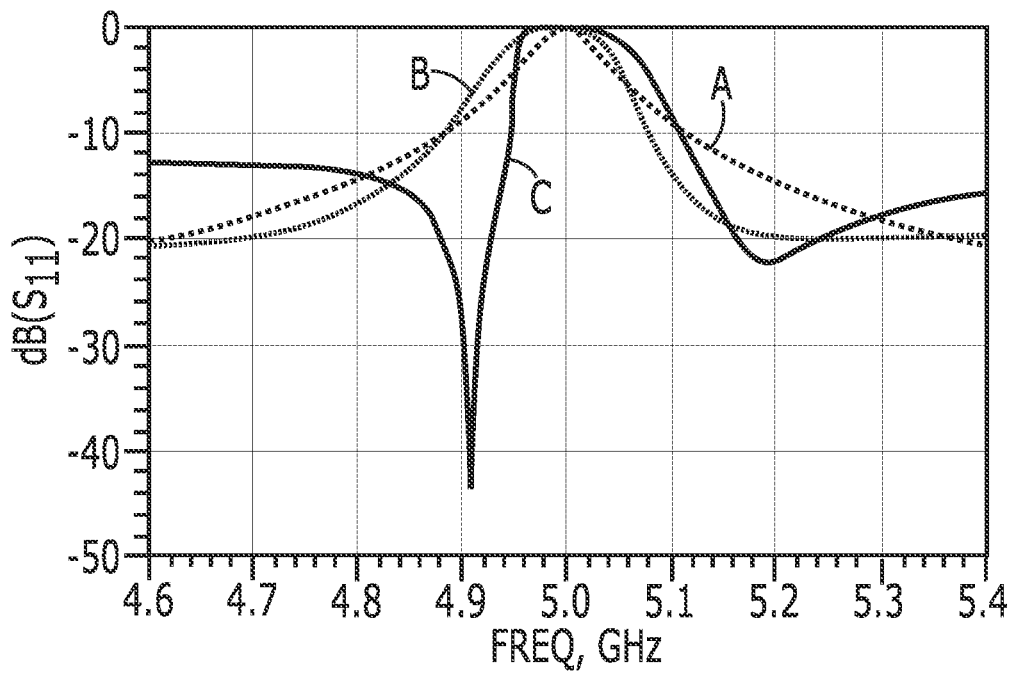

FIGS. 10A, 10B demonstrate performance of the circuitry 100 configured as different band stop filters 200. The plots labelled A are single resonance. The plots labelled B are double resonance. The plots labelled C are triple resonance. FIG. 10A plots the Transmission coefficient S21 of the three topologies. FIG. 10B plots the Reflection coefficient S11 of the three topologies. Increasing the number of resonances results in steeper filtering.

Figure 10C:
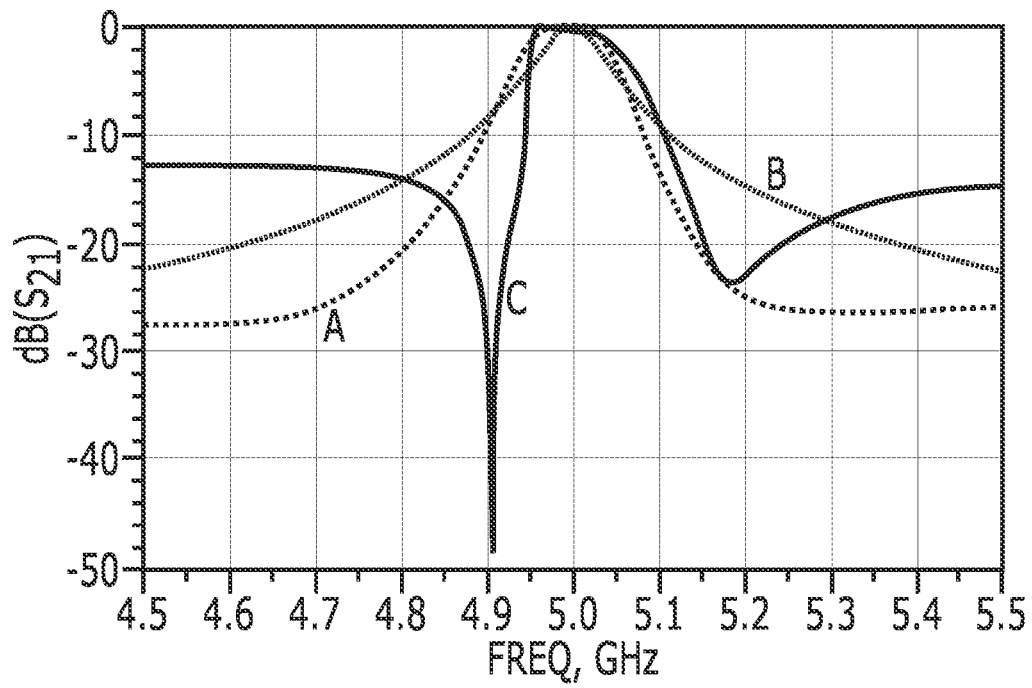
Figure 10D:
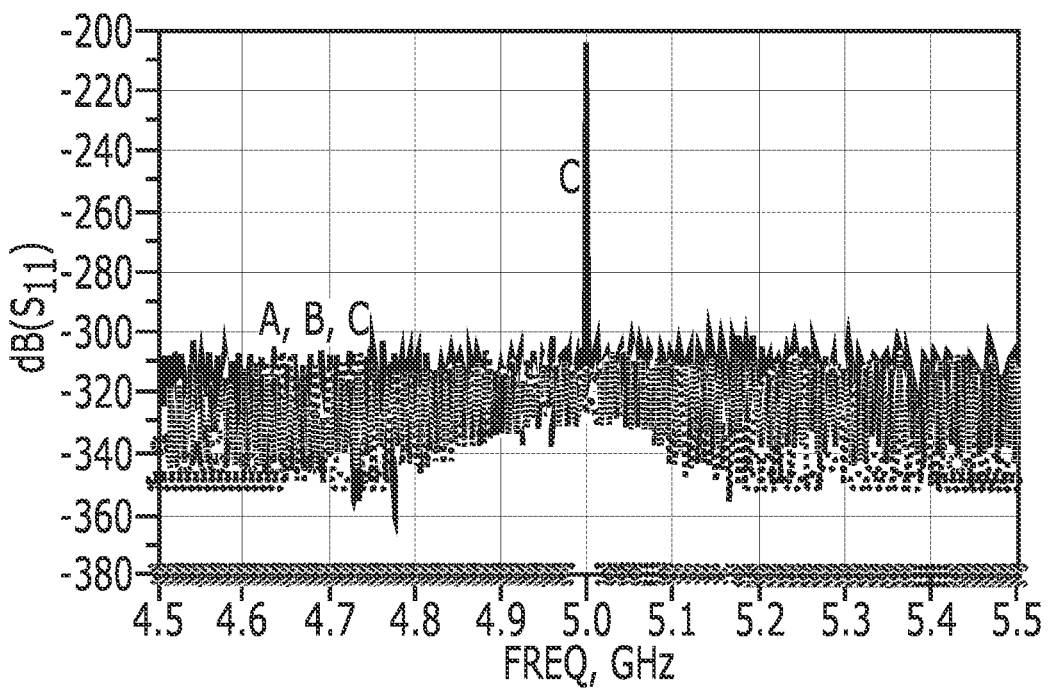

FIGS. 10C, 10D demonstrate performance of the circuitry 100 configured as different band pass filters 210. The plots labelled A are single resonance. The plots labelled B are double resonance. The plots labelled C are triple resonance. FIG. 10C plots the Transmission coefficient S21 of the three topologies. FIG. 10D plots the Reflection coefficient S11 of the three topologies.

The bandwidth of the band-stop and, hence, band-pass filters can be adjusted using the phase shifter(s) 40.

Figure 11:
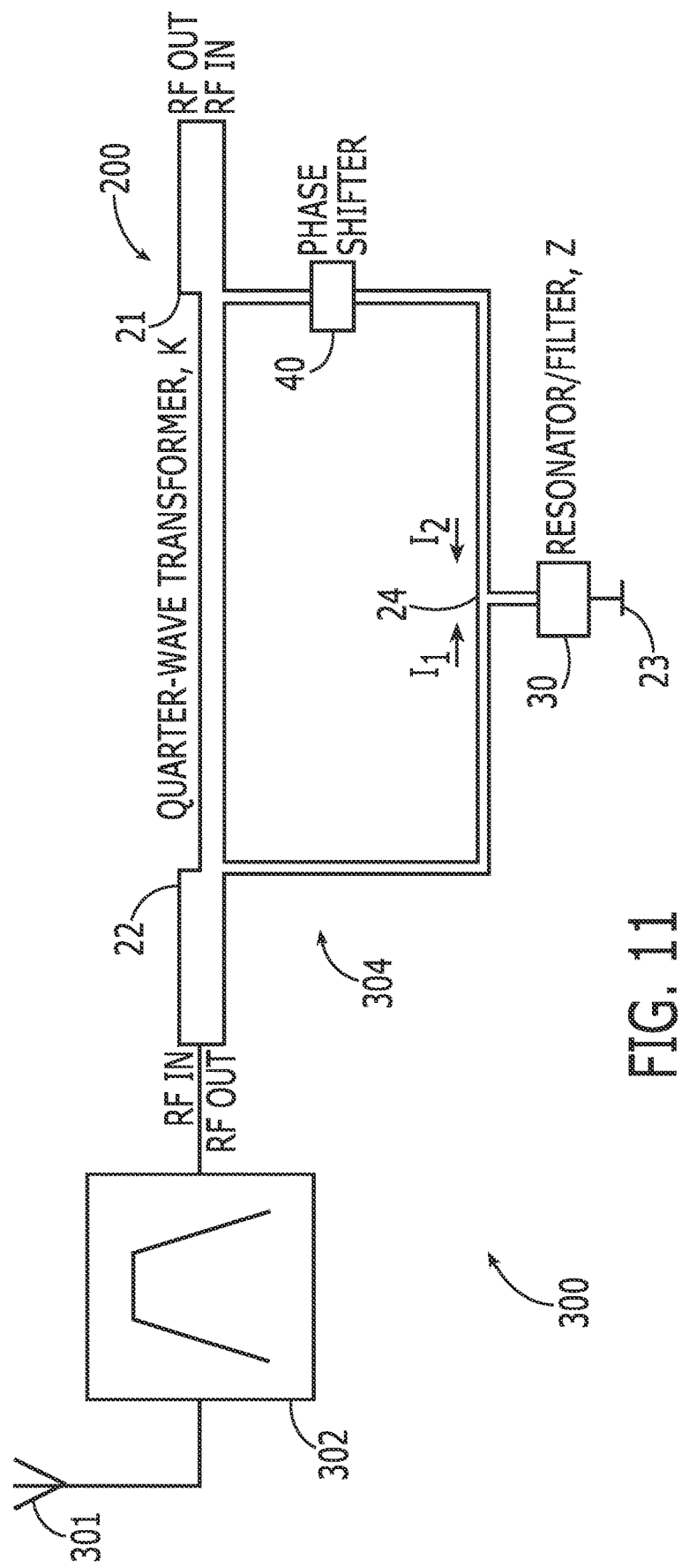
FIG. 11 shows another example of the subject matter described herein.

FIG. 11 illustrates an example of a radio transceiver 300 and, in particular, a front end (radio frequency part) of a radio transceiver. The radio transceiver comprises an antenna 301, a filter 302 and an additional filter 304 formed from circuitry 100. In this example the additional filter 304 is a band pass filter 200. In other examples it can be a band stop filter 210.

In other examples, a radio transmitter can be used instead of a radio transceiver 300. In other examples, a radio receiver can be used instead of a radio transceiver 300.

The radio transceiver 300 can be a portable electronic apparatus. Examples of portable electronic apparatus include but are not limited to user equipment, mobile stations, hand-held telephones, watches, wearables etc.

The radio transceiver 300 can be a network access point such as a base station. Examples of base stations include NodeB (and evolutions NodeB such as gNB).

The circuitry 100 can therefore be combined with an existing filter 302 to further support alteration of the filter response in a desired system to achieve performance targets.

The filter 304 can, for example, be configured to have one or more operational frequency bands that cover a 5G NR n79 band between 4.4 GHz and 5 GHz and an IEEE 802.11 a/n/ac band between 5.15 GHz and 5.825 GHz.

Where a structural feature has been described, it may be replaced by means for performing one or more of the functions of the structural feature whether that function or those functions are explicitly or implicitly described.

The above described examples find application as enabling components of: automotive systems; telecommunication systems; electronic systems including consumer electronic products; distributed computing systems; media systems for generating or rendering media content including audio, visual and audio visual content and mixed, mediated, virtual and/or augmented reality; personal systems including personal health systems or personal fitness systems; navigation systems; user interfaces also known as human machine interfaces; networks including cellular, non-cellular, and optical networks; ad-hoc networks; the internet; the internet of things; virtualized networks; and related software and services.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one." or by using "consisting".

In this description, reference has been made to various examples. The description of features or functions in relation to an example indicates that those features or functions are present in that example. The use of the term 'example' or 'for example' or 'can' or 'may' in the text denotes, whether explicitly stated or not, that such features or functions are present in at least the described example, whether described as an example or not, and that they can be, but are not necessarily, present in some of or all other examples. Thus 'example', 'for example', 'can' or 'may' refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example as part of a working combination but does not necessarily have to be used in that other example.

Although examples have been described in the preceding paragraphs with reference to various examples, it should be appreciated that modifications to the examples given can be made without departing from the scope of the claims.

Features described in the preceding description may be used in combinations other than the combinations explicitly described above.

Although functions have been described with reference to certain features, those functions may be performable by other features whether described or not.

Although features have been described with reference to certain examples, those features may also be present in other examples whether described or not.

The term 'a' or 'the' is used in this document with an inclusive not an exclusive meaning. That is any reference to X comprising a/the Y indicates that X may comprise only one Y or may comprise more than one Y unless the context clearly indicates the contrary. If it is intended to use 'a' or 'the' with an exclusive meaning then it will be made clear in the context. In some circumstances the use of 'at least one' or 'one or more' may be used to emphasis an inclusive meaning but the absence of these terms should not be taken to infer any exclusive meaning.

The presence of a feature (or combination of features) in a claim is a reference to that feature or (combination of features) itself and also to features that achieve substantially the same technical effect (equivalent features). The equivalent features include, for example, features that are variants and achieve substantially the same result in substantially the same way. The equivalent features include, for example, features that perform substantially the same function, in substantially the same way to achieve substantially the same result.

In this description, reference has been made to various examples using adjectives or adjectival phrases to describe characteristics of the examples. Such a description of a characteristic in relation to an example indicates that the characteristic is present in some examples exactly as described and is present in other examples substantially as described.

Whilst endeavoring in the foregoing specification to draw attention to those features believed to be of importance it should be understood that the Applicant may seek protection via the claims in respect of any patentable feature or combination of features hereinbefore referred to and/or shown in the drawings whether or not emphasis has been placed thereon.

The invention claimed is:

1. Circuitry comprising:
  a first resonant radio frequency conductive path comprising a first transmission line between a first node and a third node;
  a second resonant radio frequency conductive path comprising a second transmission line between a second node and the third node;
  an internode radio frequency conductive path comprising a third transmission line between the first node and the second node;
  a shunt resonant element coupled to the third node and shared by the first resonant radio frequency conductive path and the second resonant radio frequency conductive path; and
  a phase shift element for introducing a relative phase shift to the first resonant radio frequency conductive path relative to the second resonant radio frequency conductive path, wherein the first transmission line and the second transmission line comprise respective branches from the third transmission line with the first transmission line, but not the second transmission line, comprising the phase shift element.

2. Circuitry as claimed in claim 1, further comprising:
  a first radio frequency conductive path between the first node and an intermediate node;

a second radio frequency conductive path between the second node and the intermediate node; and a third radio frequency conductive path between the intermediate node and the third node, wherein the third radio frequency conductive path comprises the shunt resonant element as a frequency selective impedance that provides a lower impedance path to the third node for a narrower band of frequencies and a higher impedance path to the third node for wider bands of frequencies adjacent the narrower band of frequencies and wherein the first radio frequency conductive path comprises the phase shift element, wherein the first resonant radio frequency conductive path between the first node and the third node comprises the first radio frequency conductive path between the first node and the intermediate node and comprises the third radio frequency conductive path between the intermediate node and the third node, wherein the second resonant radio frequency conductive path between the second node and the third node comprises the second radio frequency conductive path between the second node and the intermediate node and comprises the third radio frequency conductive path between the intermediate node and the third node, and wherein the first resonant radio frequency conductive path and the second resonant radio frequency conductive path share the intermediate node and the third radio frequency conductive path between the intermediate node and the third node.

3. Circuitry as claimed in claim 1, wherein the first resonant radio frequency conductive path between the first node and the third node has a single zero transfer function, wherein the second resonant radio frequency conductive path between the second node and the third node has a single zero transfer function, and wherein the phase shift element separates the zero of the transfer function for the first resonant radio frequency conductive path from the zero of the transfer function for the second resonant radio frequency conductive path.

4. Circuitry as claimed in claim 1, wherein the first resonant radio frequency conductive path comprises a first radio frequency conductive path between the first node and ground via the shunt resonant element; and the second resonant radio frequency conductive path comprises a second radio frequency conductive path between the second node and the ground via the shunt resonant element.

5. Circuitry as claimed in claim 4, wherein the shunt resonant element has a single zero transfer function.

6. Circuitry as claimed in claim 1, wherein the first transmission line and the second transmission line are identical branches from the third transmission line except that the first transmission line comprises the phase shift element.

7. Circuitry as claimed in claim 1, wherein the phase shift element is configured to be controlled so as to change the relative phase shift between the first resonant radio frequency conductive path and the second resonant radio frequency conductive path.

8. Circuitry as claimed in claim 7, wherein the phase shift element is configured to be controlled so as to select one of a plurality of predefined phase shifts.

9. A band stop filter comprising the circuitry as claimed in claim 1, wherein the circuitry is arranged in an in-line series configuration, and wherein the in-line series configuration comprises an arrangement in which input/output nodes of the filter are coupled to the first and second nodes of the circuitry.

10. A bandpass filter comprising the circuitry as claimed in claim 1, wherein the circuitry is in a shunt configuration to ground, and wherein the shunt configuration to ground comprises a configuration in which input/output nodes of the filter are coupled to the first node of the circuitry, the second node of the circuitry is coupled to ground via an impedance, and the third node of the circuitry is coupled to ground.

11. A portable electronic device comprising the circuitry of claim 1.

12. A base station comprising the circuitry of claim 1.

13. Circuitry comprising:
two or more first resonant radio frequency conductive paths between a first node and a third node;
a second resonant radio frequency conductive path between a second node and the third node;
an internode radio frequency conductive path between the first node and the second node;
a shunt resonant element coupled to the third node and shared by the two or more first resonant radio frequency conductive paths and the second resonant radio frequency conductive path; and
phase shift elements for introducing a relative phase shift to the first resonant radio frequency conductive paths relative to the second resonant radio frequency conductive path,
wherein respective ones of the two or more first resonant radio frequency conductive paths comprise a phase shift element for introducing the relative phase shift to the respective first resonant radio frequency conductive path relative to the second resonant radio frequency conductive path.

14. A filter comprising:
first and second circuitry, wherein each of the first and second circuitry comprises:
a first resonant radio frequency conductive path between a first node and a third node;
a second resonant radio frequency conductive path between a second node and the third node;
an internode radio frequency conductive path between the first node and the second node;
a shunt resonant element coupled to the third node and shared by the first resonant radio frequency conductive path and the second resonant radio frequency conductive path; and
a phase shift element for introducing a relative phase shift to the first resonant radio frequency conductive path relative to the second resonant radio frequency conductive path; and
a four-port cross-coupler comprising four ports,
wherein a first one of the ports of the four-port cross-coupler is coupled to the first node of the first circuitry,
wherein a second one of the ports of the four-port cross-coupler is coupled to the first node of the second circuitry, and
wherein two other ports of the four-port cross-coupler provide input/output ports of the filter.

15. A filter as claimed in claim 14, wherein each of the first and second circuitry further comprises:
a first radio frequency conductive path between the first node and an intermediate node;
a second radio frequency conductive path between the second node and the intermediate node; and a third radio frequency conductive path between the intermediate node and the third node, wherein the third radio frequency conductive path comprises the shunt resonant element as a frequency selective impedance that provides a lower impedance path to the third node for a narrower band of frequencies and a higher impedance path to the third node for wider bands of frequencies adjacent the narrower band of frequencies and wherein the first radio frequency conductive path comprises the phase shift element, wherein the first resonant radio frequency conductive path between the first node and the third node comprises the first radio frequency conductive path between the first node and the intermediate node and comprises the third radio frequency conductive path between the intermediate node and the third node, wherein the second resonant radio frequency conductive path between the second node and the third node comprises the second radio frequency conductive path between the second node and the intermediate node and comprises the third radio frequency conductive path between the intermediate node and the third node, and wherein the first resonant radio frequency conductive path and the second resonant radio frequency conductive path share the intermediate node and the third radio frequency conductive path between the intermediate node and the third node.

16. A filter as claimed in claim 14, wherein the first resonant radio frequency conductive path between the first node and the third node has a single zero transfer function, wherein the second resonant radio frequency conductive path between the second node and the third node has a single zero transfer function, and wherein the phase shift element separates the zero of the transfer function for the first resonant radio frequency conductive path from the zero of the transfer function for the second resonant radio frequency conductive path.

17. A filter as claimed in claim 14, wherein the first resonant radio frequency conductive path comprises a first radio frequency conductive path between the first node and ground via the shunt resonant element; and the second resonant radio frequency conductive path comprises a second radio frequency conductive path between the second node and the ground via the shunt resonant element.

18. A portable electronic device comprising the filter of claim 14.

19. A base station comprising the filter of claim 14.

* * * * *